United States Patent [19]
Lee

[11] Patent Number: 5,705,925
[45] Date of Patent: *Jan. 6, 1998

[54] ANALOG AUTONOMOUS TEST BUS FRAMEWORK FOR TESTING INTEGRATED CIRCUITS ON A PRINTED CIRCUIT BOARD

[75] Inventor: Nai-Chi Lee, Peekskill, N.Y.

[73] Assignee: North American Philips Corporation, New York, N.Y.

[*] Notice: The term of this patent shall not extend beyond the expiration date of Pat. No. 5,581,176.

[21] Appl. No.: 447,369

[22] Filed: May 23, 1995

Related U.S. Application Data

[62] Division of Ser. No. 66,957, May 24, 1993, Pat. No. 5,581,176.

[51] Int. Cl.⁶ .................................................. G01R 31/28
[52] U.S. Cl. ..................... 324/158.1; 324/73.1; 371/22.5
[58] Field of Search ........................... 324/158.1, 73.1, 324/765, 763; 371/25.1, 15.1, 22.3, 22.5; 437/8; 257/40, 48

[56] References Cited

U.S. PATENT DOCUMENTS

| | | | |
|---|---|---|---|
| 4,791,358 | 12/1988 | Sauerwald et al. | 371/25.1 |
| 4,879,717 | 11/1989 | Sauerwald et al. | 371/22.3 |
| 4,918,379 | 4/1990 | Jongepier | 324/73.1 |
| 5,107,208 | 4/1992 | Lee | 324/158 R |
| 5,214,655 | 5/1993 | Eichelberger et al. | 371/22.5 |

FOREIGN PATENT DOCUMENTS 0489394  12/1991  European Pat. Off.

OTHER PUBLICATIONS

IEEE Standard 1149. Jan. 1990.

Freeman, "Testing Large Analog/Digital Signal Processing Chips", IEEE Transactions on Consumer Electronics, vol. 36, No. 4, Nov. 1990, pp. 813–818.

E.J. McCluskey et al., "Design for Autonomous Test", IEEE Transactions on Computers, vol. C-30, No. 11, pp.886–875, Nov. 1981.

K.D. Wagner et al., "Design for Testability for Mixed Signal Integrated Circuits", Proceedings of the IEEE 1988 International Test Conference, paper 39.1, pp. 823–828, 1988 (Month Unavailable).

P. Fasang et al., "Design for Testability for Mixed Analog/Digital ASICs", Proceedings of the IEEE 1988 Custom Integrated Circuits Conference, pp. 16.5.1–16.5.4, 1988 (Month Unavailable).

N–C Lee, "Autonomous Test Scheme for Analog ASICs", Proceedings: The Third Annual IEEE ASIC Seminar and Exhibit, Sep. 17–21, 1990, pp. P8–3.1–P8–3.5.

K.T. Kornegay et al., "A Test Controller Board for TSS", Proceedings: First Great Lakes Symposium on VLSI, pp. 38–42; IEEE 1991 (Month Unavailable).

S. Freeman, "A Test Strategy for a Bit–Serial VLSI Chip with Analog IO", Proceedings of the IEEE 1990 Custom Integrated Circuits Conference, May 13–16, 1990, pp. 28.71–28.7.5.

Goodenough, "Build Mixed–Signal ASICs without Analog Cells", Electronic Design, pp. 163–165, Sep. 12, 1991.

Hulse et al., "Panel: P1149.4 Mixed–Signal Test Bus Framework Proposal", International Test Conference 1992 Proceedings, Paper 29.1–29.3, Sep. 1992.

"Structure and Metrology for an Analog Testability Bus", by K.P. Parker et al, Proceedings International Test Converence, 1993, Jan. 1, 1993, pp. 309–322.

"A Hierarchical Analog Test Bus Framework for Testing Mixed–Signal Intergrated Circuits and Printed Circuit Boards", by N.C. Lee, Journal of Electronic Testing, 1993, pp. 361–368 (Month Unavailable).

Primary Examiner—Vinh P. Nguyen
Attorney, Agent, or Firm—Anne E. Barschall

[57] ABSTRACT

To improve testability of analog or mixed analog/digital circuit modules mounted on a carrier, three-way switches are placed at input and output ports of the circuit modules. The switches can operate to establish signal connections between a test bus and core circuits inside the modules. The switches can also establish signal connections between the test bus and glue circuits disposed between the modules.

6 Claims, 4 Drawing Sheets

ANALOG AUTONOMOUS TEST BUS FRAMEWORK FOR TESTING INTEGRATED CIRCUITS ON A PRINTED CIRCUIT BOARD

This is a division of application Ser. No. 08/066,957 filed May 24, 1993, now U.S. Pat. No. 5,581,176.

I. BACKGROUND OF THE INVENTION

A. Field of the Invention

The invention relates to testing analog circuit modules and in particular analog circuit modules on a carrier or printed circuit board.

B. Related Art

The invention is an improvement on U.S. Pat. No. 5,107,208, which is incorporated herein by reference. This prior art scheme is particularly suited to dividing integrated circuits into submodules for testing.

The invention is also related to the field of boundary scan of digital circuits. A general scheme for testing digital circuits on a carrier has been proposed in IEEE Std 1149.1-1990, "IEEE Standard Test Access Port and Boundary-Scan Architecture". This scheme allows digital circuits to be designed for testability.

Another digital testing scheme, which uses a divide and conquer approach, is found in E. J. McCluskey and S. Boaorgui-Nesbat, "Design for Autonomous Test", *IEEE Transactions on Computers*, Vol. C-30, No. 11, pp. 886–875, 11/81.

Analog circuits also need to be designed for testability. The typical analog circuit is more difficult to test than the typical digital circuit, for reasons including the following. Analog modules are tightly coupled, with everything depending on everything else. Design margins are tight for analog circuits, as compared with large safety margins built into digital circuits. Analog circuits have complex signal types, which mean that direct access is usually required in order to observe or control analog signals, unlike digital signals which can be easily observed/controlled using shift registers. There is no ability to freeze internal states, such as charge on capacitors, of analog circuits, while the digital circuits have enable signals or clocks. Analog circuits are sensitive to input noise and output loading effects. Analog circuits do not have well-defined I/O port types. A single port may serve multiple purposes, such as charging/discharging of a capacitor, plus detection of threshold voltages, so that classification into either "input" or "output" may be obscured. There is no formal specification for analog functions, unlike the simple boolean equations or hardware description languages used in the digital world. There are no elementary and universal fault models for marginal failures in analog circuits, unlike the "stuck-at-0/1" models which were highly successful in digital circuits, but are not sufficient in the analog world.

Some design for testability schemes for analog/mixed signal circuits have been presented. These include K. D. Wagner and T. W. Willie, "Design for Testability of Mixed Signal Integrated Circuits", *Proceedings of the IEEE 1988 International Test Conference*, paper 39.1, pp. 823–828, 1988;

P. Fasang et al., "Design for Testability for Mixed Analog/Digital ASICs", *Proceedings of the IEEE 1988 Custom Integrated Circuits Conference*, pp. 16.5.1–16.5.4, 1988;

U.S. Pat. No. 4,918,379;

S. Freeman "Testing large Analog/Digital Signal Processing Chips, *IEEE Transactions on Consumer Electronics*, Vol. 36, No. 4, pp. 813–818, November 1990;

F. Goodenough, "Build Mixed-Signal ASICS without Analog Cells", *Electronic Design*, pp. 163–165, Sep. 12, 1991;

M. Soma etc., "Panel: P1149.4 Mixed-Signal Test Bus Framework Proposal", *International Test Conference 1992 Proceedings*, Paper 29.1–29.3, September 1992.

These schemes suffer from some or all of the following drawbacks.

- They are not hierarchical, i.e. they do not apply uniformly to both chip and board levels.
- Continuity of normal signal path between submodules (whether at chip or board level) is not ensured. This implies that after the completion of individual testing for submodules, additional testing at the next higher level is still necessary to ensure the proper connection between submodules.
- Applicability of each scheme is often restricted to a specific topology or a specific class of analog circuits. For example, a popular misrepresentation of analog circuits consists of a linear chain of analog blocks, each having exactly one input and one output. This misrepresentation leads to testing schemes which lack general applicability.
- True Analog AC testing is often avoided or deferred. Some typical approaches are:
    - Isolate the analog portion from a mostly-digital circuit, such that analog testing can be dealt with later by someone else. This approach does not work for mostly-analog circuits, or cases when the analog testing is too complex;
    - Convert the input/output ports of an analog block to digital (using D/A and A/D converters) so that the testing can be conducted digitally. Only DC (static) testing for the analog block can be done in this case, while real time AC (dynamic) testing is not feasible. Large area overhead is also incurred by the converters necessary for every analog I/O port.

II. SUMMARY OF THE INVENTION

The object of the invention is to provide an improved analog testing scheme.

The object of the invention is achieved by placing three-way analog switches at selected ports of circuit modules. The circuits may be analog or mixed analog/digital. The three-way analog switches provide connections between a test bus and the ports; and thereby provide the capability to control and/or observe signals at the ports externally, via the test bus.

In one embodiment, the switches are placed between pins of an integrated circuit and internal inputs and/or outputs of a core circuit of that integrated circuit.

In another embodiment, the switches are stand-alone components physically separated from the ICs (integrated circuits) which are to be controlled and/or observed.

III. BRIEF DESCRIPTION OF THE DRAWING

The invention will now be described by way of non-limitative example with reference to the following drawings.

FIG. 4b shows a second test path on the printed circuit board of FIG. 4a.

IV. DETAILED DESCRIPTION OF THE PREFERRED EMBODIMENTS

For the purposes of this document, the following definitions will be used. The phrase IC package is used interchangeably with the word "chip". The word carrier means any medium carrying circuit modules testable using the invention. Printed circuit boards are an example of a carrier. The word "port" means any electrical signal connection to a module, such as a pin on a chip or a connector on a printed circuit board.

Figure 1:
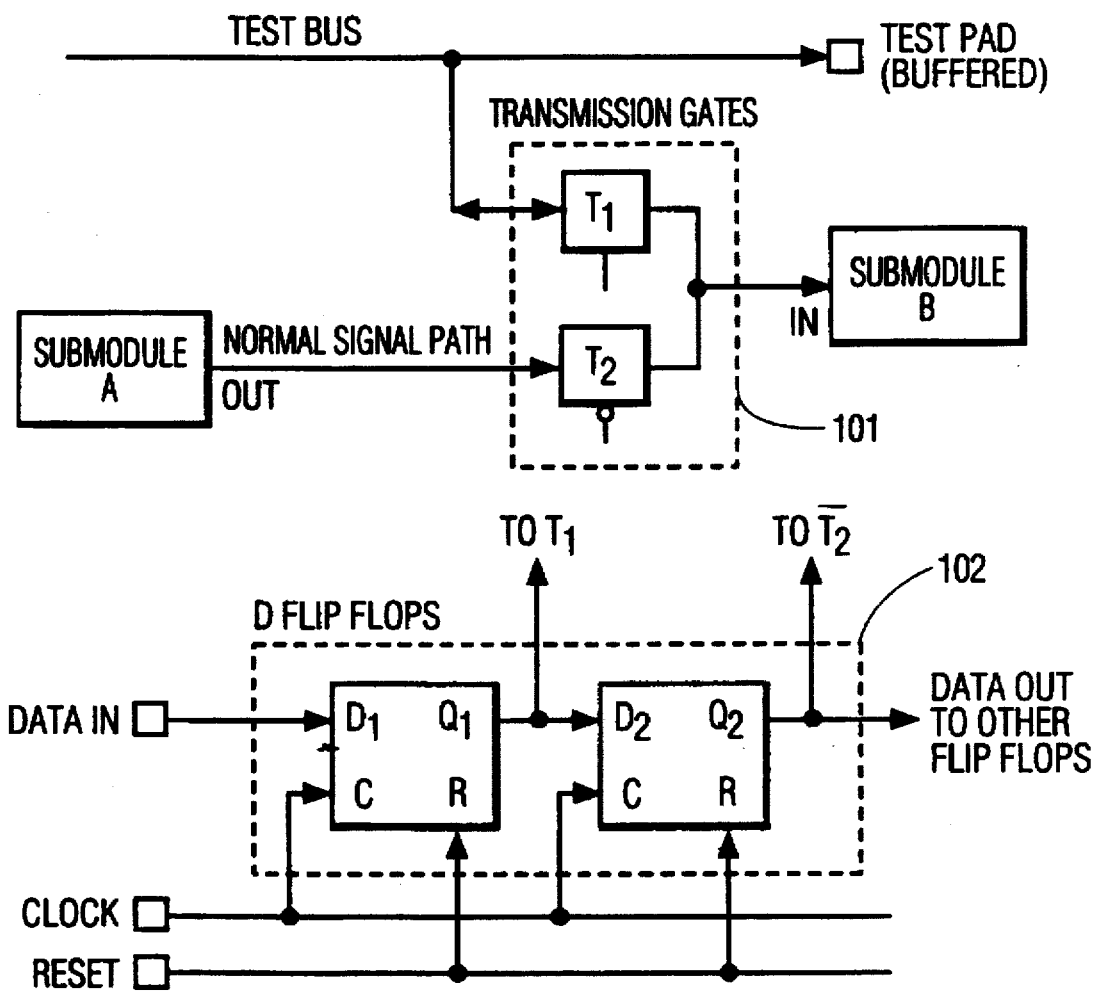
FIG. 1 shows a prior art three-way switch.

FIG. 1 shows the prior art switch of U.S. Pat. No. 5,107,208. The three-way switch 101 is composed of two transmission gates $T_1$ and $T_2$ and is disposed between two submodules A and B. Under control of D flip-flops 102, The three-way switch allows transmission along one of three paths: i) a normal data path from A to B, ii) a first test path from the test bus to B, or iii) a second test path from A to the test bus. The switch can assume the states of the following table

TABLE I

| $Q_1$ | $Q_2$ | $T_1$ | $T_2$ | FUNCTION |
|---|---|---|---|---|
| 0 | 0 | OFF | ON | normal operation: output of module A goes to input of B |
| 1 | 1 | ON | OFF | control input to module B (during test mode for B) |
| 1 | 0 | ON | ON | observe output from module A (during test mode for A) |
| 0 | 1 | OFF | OFF | both output of A and input of B are isolated |

The flip-flops in turn are controlled by input data signals on the port Data in, and by their clock and reset inputs.

As explained in the prior patent, the three-way switch 101 can also contain three transmission gates as well as two.

Figure 2:
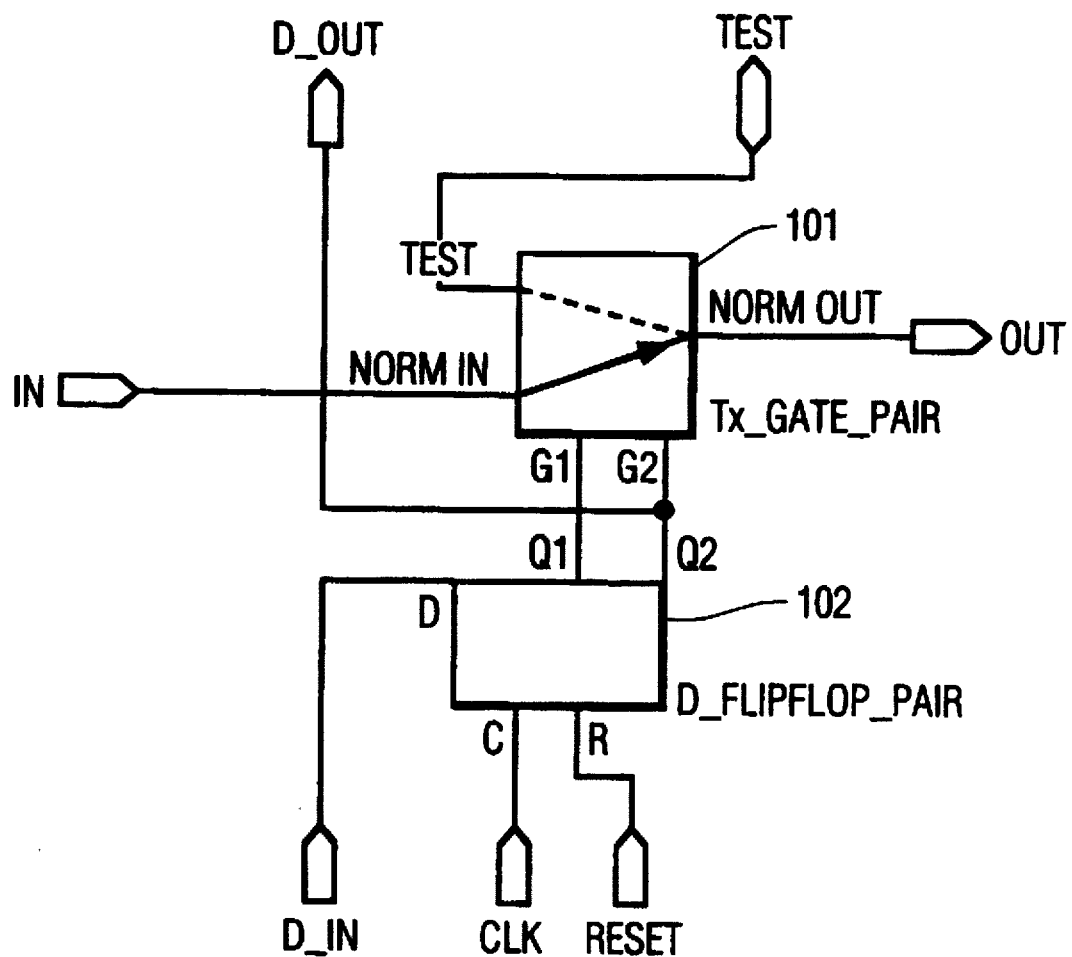
FIG. 2 shows an analog switch cell.

FIG. 2 shows a switching cell, incorporating elements of the three-way switch of FIG. 1, but suitable for duplication at various points of circuit modules or carriers, either as a stand-alone component, or as part of a switching network surrounding a core circuit of an IC package. Boxes 101 and 102 are the same as in FIG. 1. There are four input ports, IN, D_in, CLK, and Reset, corresponding to the following in FIG. 1: input to block 101 from submodule A, Data In, Clock, and Reset, respectively. There are two output ports, OUT and D_out, corresponding to the output from block 101 to submodule B and Data out, respectively. There is a bi-directional test port corresponding to the connection from block 101 to the test bus.

Figure 3:
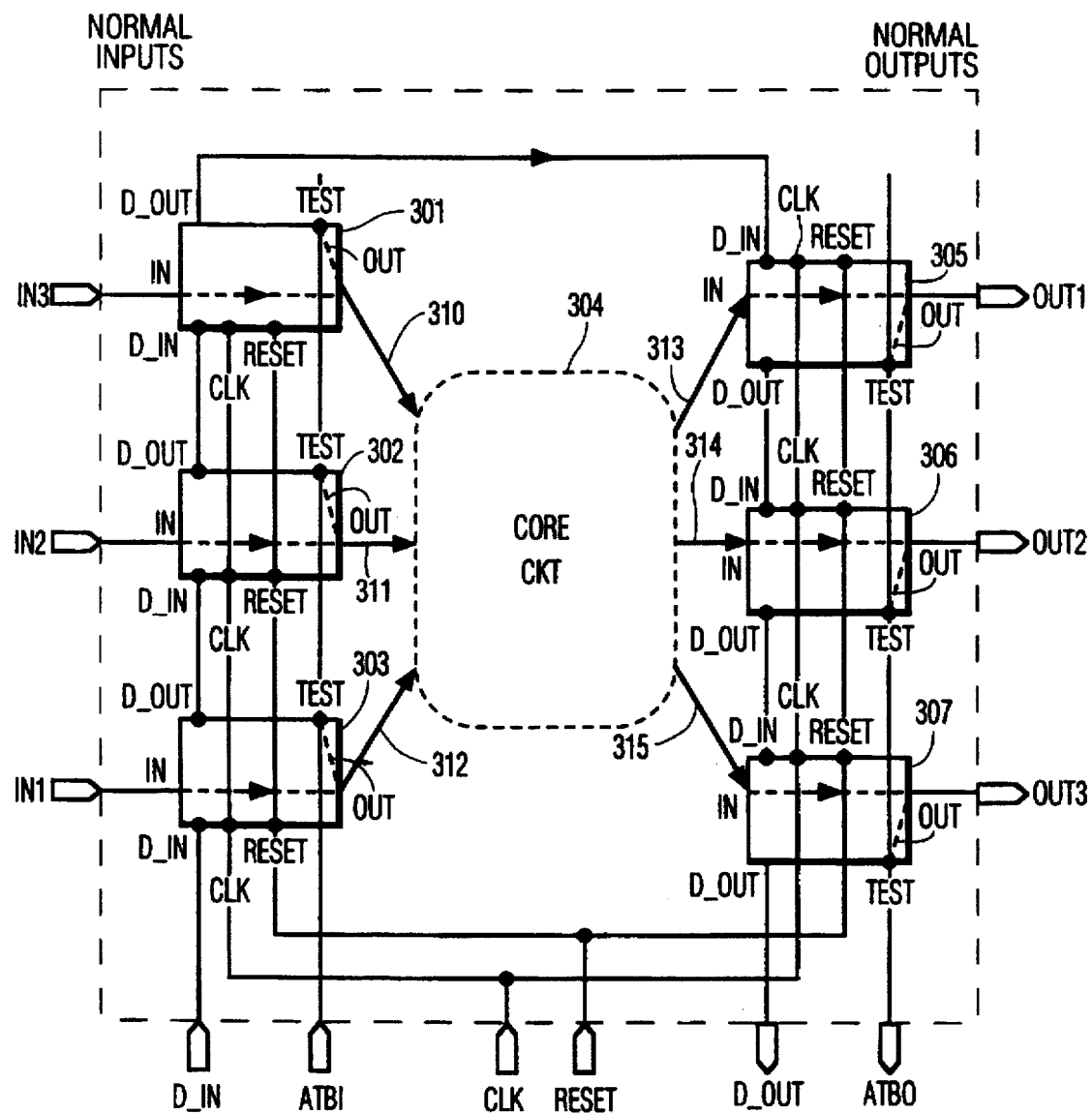
FIG. 3 shows an IC package including a core circuit with analog switch cells placed at selected ports of the package.

FIG. 3 shows an IC package. The IC package contains a core circuit 304 which performs the principal function of the IC. The core circuit has internal inputs and outputs which are connected to the ports of the package via switching cells according to FIG. 2. In this case, six such internal inputs and outputs are shown 310–315. Switching cells 301–303 are connected between internal inputs 310–312 and ports IN3, IN2, and IN1 of the IC package, respectively. Switching cells 305, 306, and 307 are connected between internal outputs 313–315 and ports OUT1, OUT2, and OUT3 of the IC package, respectively.

The D_in and D_out ports of cells 301, 302, 303, 305, 306, and 307 are all connected to a D_in/D_out serial bus, with the D_out of each cell being connected to the D_in of a next cell. The Reset and CLK ports are connected to Reset and CLK buses, respectively. The Test ports of cells 301, 302, and 303 are connected to a test bus wire ATBI. The test ports of cells 305, 306, and 307 are connected to a test bus wire ATBO. ATBI and ATBO together form a two wire test bus. One of ordinary skill in the art might add more test bus wires to accommodate additional types of testing.

The cells of FIG. 3 are configured, so that a single input port and/or a single output port can be enabled at a time, according to a test sequence loaded on D_in. For instance, shifting in a control sequence 00 00 01 00 00 11 on D_in will cause the flip-flops of the switching cells 301, 302, 303, 305, 306, and 307 to be loaded according to the following table

TABLE II

| 303 | | 302 | | 301 | | 305 | | 306 | | 307 | |
|---|---|---|---|---|---|---|---|---|---|---|---|
| 1 | 1 | 0 | 0 | 0 | 1 | 0 | 0 | 0 | 0 | 0 | 0 |

This will control switching cell 303 to connect the test bus wire ATBI to internal input 312 of the core circuit. This will also control switching cell 305 to connect the test bus wire ATBO to internal output 313. Switching cells 301, 302, 306, and 307 will be controlled to establish their normal paths, connecting their respective IN ports to their respective OUT ports. Thus IN2, IN3, OUT2, and OUT3 will be connected to internal ports 311, 310, 314, and 315 of the core circuit, respectively. It should be noted that the bit values for the respective switching cells shown in table II correspond to the values of $Q_1$ and $Q_2$ from table I.

Where necessary, more ports may be connected to test bus wires, especially where there are more than two such wires.

In the above-described embodiment, the switch cells 301–303 and 305–307 are enclosed in the same physical package (chip). Alternatively, the switch cells 301–303 may be enclosed in one chip, the core circuit 304 in another chip, and the switch cells 305–307 in a third chip. The package enclosing cells 301–303 would be identical to that enclosing cells 305–307, with the first package being connected to test bus wire ATBI and the second being connected to test bus wire ATBO. This alternative embodiment would have the advantage of not requiring any modification in current off-the-shelf chips.

Figure 4A:
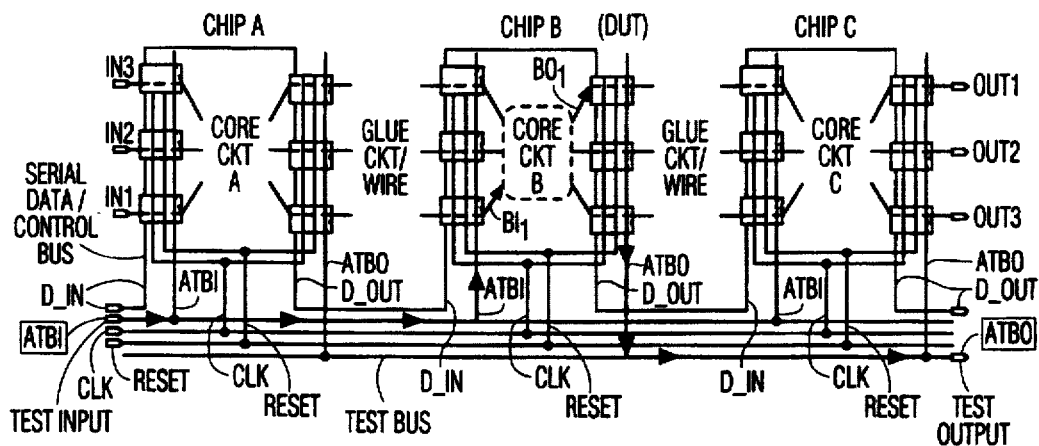
FIG. 4a shows a test path on a printed circuit board populated with chips according to FIG. 3.

FIG. 4a shows a carrier with three chips, A, B, and C, as shown in FIG. 3. Each chip contains a respective core circuit. The chips are connected via their ports and glue circuits. The term "glue circuits", as used herein, means any circuitry connecting chips according to FIG. 3. The term "glue circuit" includes simple wires, discrete components such as resistors and capacitors, or other integrated circuits not according to FIG. 3.

In FIG. 4a a data signal path is highlighted in which an internal input BI1 to the core circuit of chip B is connected to take data signals from the test bus wire ATBI. The internal output BO1 of the core circuit of chip B is connected to put data signals on the test bus wire ATBO. The signal path thus established enables an external test signal to be injected directly to the internal node BI1. The signal at internal node BO1 can also be observed externally. Testability of the core circuit of chip B is therefore improved.

Figure 4B:
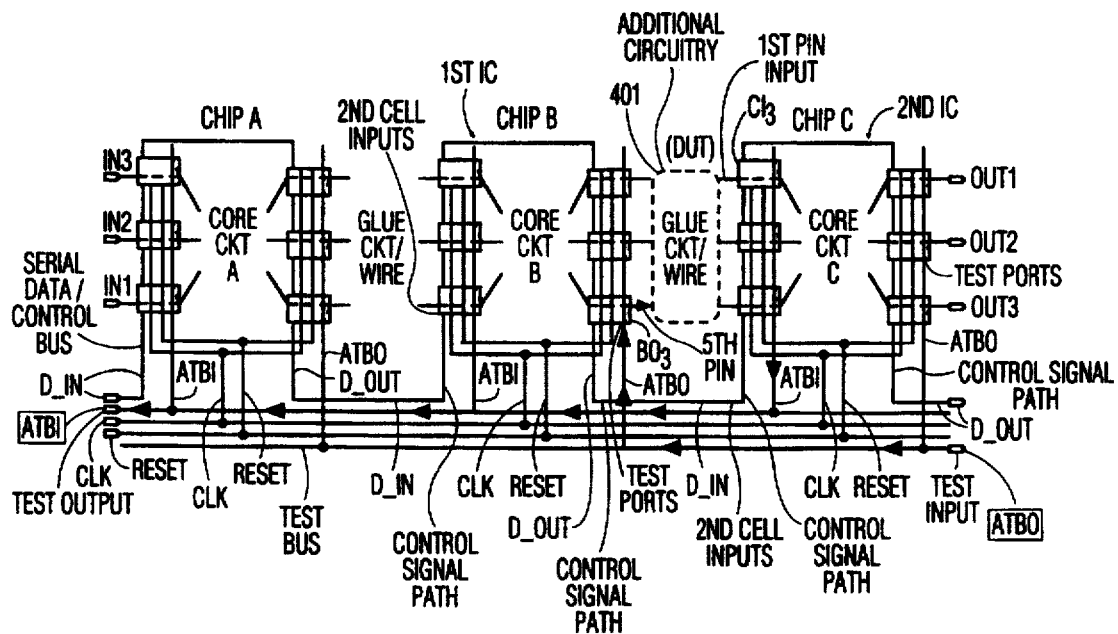

FIG. 4b shows the same carrier as that shown in FIG. 4a. In FIG. 4b it is desired to test the glue circuit 401. The highlighted data signal path used for this test goes in the opposite direction as that shown in FIG. 4a. In this test, the output of switching cell BO3 of chip B is controlled to take test data signals from test bus wire ATBO and connect these signals to the glue circuit 401. One of the input switching cells CI3 of chip C is controlled to take data signals from the glue circuit 401 and connect it to test bus wire ATBI. The signal path thus established enables an external test signal to be injected directly to an input of the glue circuit 401. A signal at an output of 401 can also be observed externally. Testability of the glue circuit 401 is therefore improved.

Analogously, switching cells according to the invention could be placed between connectors of the printed circuit board and the core circuit of the printed circuit board. In such a case, the carrier would be the system into which the printed circuit boards are plugged. Then the glue circuits would be connections between printed circuit boards.

I claim:

1. A system for routing data relating to a test of a core circuit of an integrated circuit chip, which core circuit is at least partly analog and has an input and an output, the system comprising:

(a) a first test bus external to the integrated circuit,
   (b) a source of control signals,
   (c) a first switching cell, said first switching cell having a first input, control second input, an output, and a bidirectional test port,
   (d) first means for coupling the switching cell second input with the source of control signals,
   (e) second means for coupling the switching cell output with the core circuit input,
   (f) third means for coupling the switching cell test port with the first test bus,
   (g) fourth means for coupling the switching cell input to a normal input path for the core circuit, and
   (h) said first switching cell in response to signals received at its second input being placeable into one of plural states including a first state, a second state, and a third state, when placed in its first state said first switching cell coupling its first input with its output to form a normal path to the core circuit, when placed in its second state said first switching cell coupling its test port with its output to form a test input path for the core circuit, when placed in its third state said first switching cell coupling its first input with its test port to form a test output path.

2. The system of claim 1, further comprising
   α. a second test bus external to the integrated circuit; and
   β. a second switching cell, said second switching cell having
      i. a first input,
      ii. a control second input,
      iii. an output,
      iv. a bidirectional test port,
      v. fifth means for coupling the second switching cell input with the output of the core circuit,
      vi. sixth means for coupling the second switching cell test port with the second test bus, and
      vii. seventh means for coupling the second switching cell output with a normal output path of the respective core circuit,
   said second switching cell in response to signals received at its second input being placeable into one of plural states including a first state, a second state, and a third state, when placed in its first state said second switching cell coupling its first input with its output to form a normal path from a core circuit of the integrated circuit chip, when placed in its second state said second switching cell coupling its test port with its output to form a test input path, when placed in its third state said second switching cell coupling its first input with its test port to form a test output path for the core circuit.

3. The system of claim 2 comprising a plurality of such first cells for testing a plurality of inputs of the core circuit and a plurality of such second cells for testing a plurality of outputs of the core circuit, the first and second switching cells being arranged in a boundary scan like chain around the core circuit.

4. A system for routing data related to a test of a core circuit of an integrated circuit chip, which core circuit is at least partly analog and has an input and an output, the system comprising:

(a) a first test bus external to the integrated circuit,
   (b) a source of control signals,
   (c) a first switching cell, said first switching cell having a first input, control second input, an output, and a bidirectional test port,
   (d) first means for coupling the switching cell second input with the source of control signals,
   (e) second means for coupling the switching cell input with an output of the core circuit,
   (f) third means for coupling the switching cell test port with the first test bus,
   (g) fourth means for coupling the switching cell output to a normal output path for the core circuit, and
   (h) said first switching cell in response to signals received at its second input being placeable into one of plural states including a first state, a second state, and a third state, when placed in its first state said first switching cell coupling its first input with its output to form a normal path from the core circuit, when placed in its second state said first switching cell coupling its test port with its output to form a test output path, when placed in its third state said first switching cell coupling its first input with its test port to form a test output path for the core circuit.

5. A carrier comprising
   a. a plurality of integrated circuit chips, each comprising a core circuit to be tested, at least one of the core circuits being at least partly analog;
   b. first and second test buses, external to the integrated circuit chips;
   c. a source of control signals;
   d. a plurality of switching cells, each switching cell comprising a first input, control second input, an output, and a bidirectional test port, the switching cells being arranged in a boundary scan like chain around the integrated circuit chips, each switching cell being either an input switching cell or an output switching cell
      I. each input switching cell being disposed to route test data related to at least a respective input function of a respective core circuit of a respective one of the integrated circuits, such respective input switching cell, in response to signals received at its second input being placeable into one of plural states including a first state, a second state, and a third state,
         α. when placed in its first state, such respective input switching cell coupling its first input with its output to form a normal path to the respective core circuit of that input switching cell,
         β. when placed in its second state, such respective input switching cell coupling its test port with its output to form a test input path for the respective core circuit of that input switching cell, and γ. when placed in its third state, such respective input switching cell coupling its first input with its test port to form a test output path; and ii. each output switching cell being disposed to route test data related to at least a respective output function of a respective core circuit of a respective one of the integrated circuits, such respective output switching cell, in response to signals received at its second input being placeable into one of plural states including a first state, a second state, and a third state, α. when placed in its first state, such respective output switching cell coupling its first input with its output to form a normal path from the respective core circuit of that output switching cell, β. when placed in its second state, such respective output switching cell coupling its test port with its output to form a test input path, and γ. when placed in its third state, such respective output switching cell coupling its first input with its test port to form a test output path for the respective core circuit of that output switching cell;

e. for each respective input switching cell,
  I. respective first means for coupling the respective input switching cell second input with the source of control signals;
  ii. respective second means for coupling the respective input switching cell output with the respective core circuit input;
  iii. respective third means for coupling the respective input switching cell test port with the first test bus; and
  iv. respective fourth means for coupling the respective input switching cell input to a normal input path for the core circuit; and f. for each respective output switching cell,
  I. respective fifth means for coupling the switching cell second input with the source of control signals;
  ii. respective sixth means for coupling the switching cell first input with the output of the core circuit;
  iii. respective seventh means for coupling the test port with the second test bus; and
  iv. respective eighth means for coupling the switching cell output with a normal output path of the respective core circuit; and g. at least one glue circuit or wire coupling the chips via at least one of the input and/or output switching cells.

6. The carrier of claim 5 wherein the third state of at least one of the switching cells is for testing the glue circuit.

* * * * *